(12) United States Patent
Chou et al.

(10) Patent No.: US 11,527,285 B2
(45) Date of Patent: Dec. 13, 2022

(54) RRAM CURRENT LIMITING METHOD

(71) Applicant: TAIWAN SEMICONDUCTOR MANUFACTURING COMPANY, LTD., Hsinchu (TW)

(72) Inventors: Chung-Cheng Chou, Hsinchu (TW); Zheng-Jun Lin, Hsinchu (TW); Pei-Ling Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 20 days.

(21) Appl. No.: 17/200,416

(22) Filed: Mar. 12, 2021

(65) Prior Publication Data

US 2021/0201994 A1   Jul. 1, 2021

Related U.S. Application Data

(62) Division of application No. 16/415,785, filed on May 17, 2019, now Pat. No. 10,950,303.

(60) Provisional application No. 62/679,557, filed on Jun. 1, 2018.

(51) Int. Cl.
*G11C 11/00* (2006.01)
*G11C 13/00* (2006.01)

(52) U.S. Cl.
CPC ........ G11C 13/0038 (2013.01); G11C 13/003 (2013.01); *G11C 2213/15* (2013.01); *G11C 2213/79* (2013.01)

(58) Field of Classification Search
CPC .............. G11C 13/0038; G11C 13/003; G11C 2213/15; G11C 2213/79; G11C 2013/0092; G11C 13/004; G11C 13/0069; G11C 13/0026; G11C 2213/82; G11C 13/0002; G11C 13/0021; G11C 5/143; G11C 13/0007
USPC ....................................................... 365/148
See application file for complete search history.

(56) References Cited

U.S. PATENT DOCUMENTS

| | | | |
|---|---|---|---|
| 7,414,902 B2 * | 8/2008 | Resta | G11C 13/0004 365/185.25 |
| 7,692,958 B2 * | 4/2010 | Parkinson | G11C 13/003 365/185.24 |
| 8,315,113 B2 | 11/2012 | Yoon | |
| 8,773,887 B1 * | 7/2014 | Naji | G11C 11/1653 365/158 |

(Continued)

FOREIGN PATENT DOCUMENTS

| | | |
|---|---|---|
| CN | 102077292 | 2/2011 |
| CN | 104240757 A | 12/2014 |
| KR | 20160132014 | 11/2016 |

OTHER PUBLICATIONS

Office Action dated Apr. 15, 2021 for corresponding case No. TW 11020346430. (pp. 1-12).

(Continued)

*Primary Examiner* — Tha-O H Bui
(74) *Attorney, Agent, or Firm* — Hauptman Ham, LLP (57) ABSTRACT

A method of forming a filament in a resistive random-access memory (RRAM) device includes applying a cell voltage across a resistive layer of the RRAM device, detecting an increase in a current through the resistive layer generated in response to the applied cell voltage, and in response to detecting the increase in the current, using a first switching device to reduce the current through the resistive layer.

20 Claims, 6 Drawing Sheets

(56) References Cited

U.S. PATENT DOCUMENTS

| | | | |
|---|---|---|---|
| 9,202,561 B1 | 12/2015 | Park et al. | |
| 10,163,505 B2 * | 12/2018 | Lee | G11C 13/004 |
| 10,755,780 B2 * | 8/2020 | Lin | G11C 13/004 |
| 10,839,898 B2 * | 11/2020 | Indiveri | G11C 13/0069 |
| 10,930,344 B2 * | 2/2021 | Chou | G11C 13/0038 |
| 2003/0001662 A1 | 1/2003 | Callahan, Jr. | |
| 2004/0160837 A1 | 8/2004 | De Santis | |
| 2009/0323391 A1 | 12/2009 | Scheuerlein | |
| 2010/0085794 A1 | 4/2010 | Chen et al. | |
| 2011/0032747 A1 | 2/2011 | Yoon et al. | |
| 2014/0016414 A1 | 1/2014 | Tsai | |

OTHER PUBLICATIONS

Office Action dated Jun. 28, 2021 for corresponding case No. CN 201910477959.7 (pp. 1-7).
Office Action dated Dec. 4, 2019 from corresponding application No. TW 108118374.
Office Action dated Nov. 4, 2020 for corresponding case No. CN 201910477959. (pp. 1-12).

* cited by examiner

RRAM CURRENT LIMITING METHOD

PRIORITY CLAIM

The present application is a divisional of U.S. application Ser. No. 16/415,785, filed May 17, 2019, which claims the priority of U.S. Provisional Application No. 62/679,557, filed Jun. 1, 2018, which is incorporated herein by reference in its entirety.

BACKGROUND

In some applications, memory circuits store data in arrays that include resistive random-access memory (RRAM) cells. An individual RRAM cell is programmable to a high resistance state (HRS) or a low resistance state (LRS), each state representing a logical state stored by the RRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a circuit is configured to limit a current, e.g., an RRAM programming current, by including a bias voltage generator and a current limiter. The bias voltage generator is configured to receive a first reference voltage and a first current, and output a bias voltage. The current limiter is configured to receive the bias voltage, a second reference voltage, and a second current at an input terminal, and limit the second current to current limit levels responsive to the second reference voltage and a voltage level at the input terminal. By responding to the input terminal voltage level, the circuit is capable of dynamically limiting the second current during a programming operation, e.g., forming a filament in an RRAM device. The voltage level of the input terminal is based on the bias voltage such that the dynamic current limiting capability depends in part on the first reference voltage and the first current.

By reducing voltage and current after a predetermined RRAM current is reached during the programming operation, the circuit operates to avoid overstress conditions, thereby improving programming reliability compared to approaches in which voltage and current are not reduced after a predetermined RRAM current is reached.

In some embodiments, the circuit is configured to further limit or switch off current after a predefined delay period after the predetermined RRAM current is reached, thereby enabling control of filament growth to improve data retention compared to approaches in which RRAM current is not further limited or switched off after a predefined delay period after a predetermined current is reached.

Figure 1:
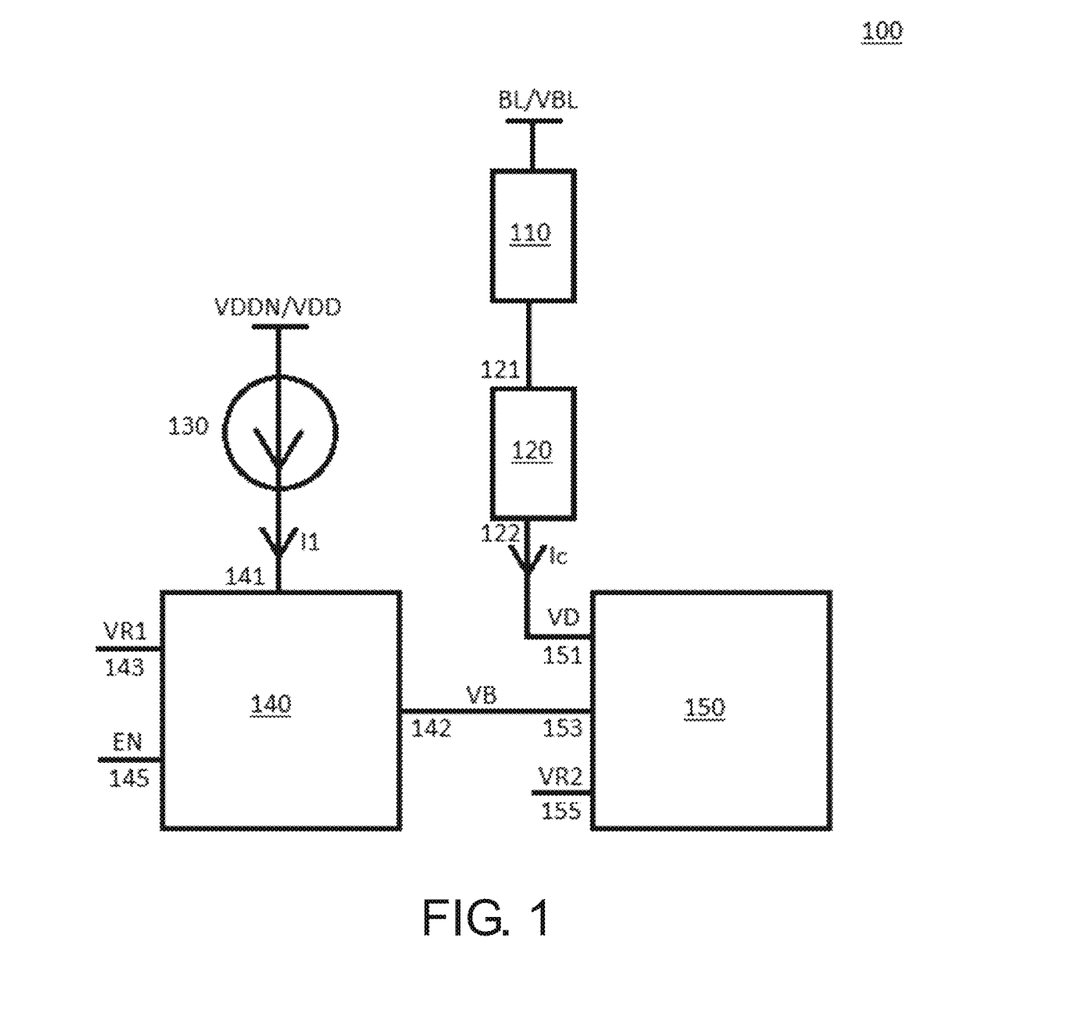
FIG. 1 is a diagram of a memory circuit, in accordance with some embodiments.

FIG. 1 is a diagram of a memory circuit 100, in accordance with some embodiments. Memory circuit 100 includes a selection circuit 110, a memory cell 120, a current source 130, a bias voltage generator 140, and a current limiter 150. As discussed below, bias voltage generator 140 is configured to output a bias voltage VB based on a current I1 received from current source 130, and current limiter 150 is configured to limit a current Ic based on bias voltage VB and a voltage VD at an input terminal 151, memory circuit 100 thereby being configured to limit current Ic through memory cell 120.

Selection circuit 110 and memory cell 120 are coupled in series between a bit line BL and current limiter 150. Current source 130 and bias voltage generator 140 are coupled in series between a power supply node VDDN and current limiter 150. Two or more circuit elements are considered to be coupled based on a direct electrical connection or an electrical connection that includes one or more additional circuit elements and is thereby capable of being controlled, e.g., made resistive or open by a transistor or other switching device.

In some embodiments, memory circuit 100 is a subset of a memory macro (not shown) that includes one or more additional components, e.g., at least one memory cell (not shown) in addition to memory cell 120 or a memory array (not shown) that includes memory cell 120 and a plurality of additional memory cells. In various embodiments, memory circuit 100 does not include one or more of selection circuit 110, memory cell 120, or current source 130.

Bit line BL is a data line configured to carry a bit line voltage VBL. Bit line voltage VBL has various bit line voltage levels that include levels corresponding to one or more read and/or write operations, discussed below with respect to memory cell 120.

Selection circuit 110 is an electronic circuit configured to selectively couple memory cell 120 to bit line BL responsive to a selection signal (not shown) having a logical state corresponding to selection of one or more memory cells including memory cell 120. In various embodiments, selection circuit 110 is one of a selection circuit 200A or 200B discussed below with respect to FIGS. 2A and 2B.

In some embodiments, a signal has either a high logical state or a low logical state. The high logical state corresponds to the signal having a voltage level less than a first predetermined threshold below an operating voltage level of memory circuit 100, and the low logical state corresponds to the signal having a voltage level less than a second predetermined threshold above a power supply reference voltage level of memory circuit 100.

Memory cell 120 is a memory cell including an RRAM device, e.g., an RRAM device 300 discussed below with respect to FIGS. 3A and 3B, and includes an input terminal 121 coupled to selection circuit 110 and an output terminal 122 coupled to current limiter 150. The RRAM device includes a dielectric capable of having either insulating properties corresponding to the HRS or conductive properties corresponding to the LRS based on the respective absence or presence of one or more filaments, also referred to as conduction paths. In operation, filaments are formed, thereby setting RRAM devices to the LRS, based on one or more of various mechanisms, e.g., vacancy or defect migration or another suitable mechanism, and broken, thereby resetting RRAM devices to the HRS, based on heating or one or more other suitable mechanisms.

Memory cell 120 is thereby configured to have the HRS that represents a first logical state and the LRS that represents a second logical state different from the first logical state. In some embodiments, memory cell 120 includes a switching device, e.g., a pass gate, and is thereby configured to be selectable responsive to a signal, e.g., a word line signal, received at an additional input terminal (not shown). In some embodiments, memory cell 120 is one memory cell of a row or column of memory cells (not shown) selectable through selection circuit 110 or through a selection device (not shown) between memory cell 120 and current limiter 150.

Memory cell 120 is programmable and readable based on a cell voltage equal to a difference between a voltage level (not labeled) at input terminal 121 and voltage level VD at output terminal 122. When input terminal 121 is coupled to bit line BL through selection circuit 110, the voltage level at input terminal 121 is equal to the voltage level of bit line voltage VBL. In some embodiments, the voltage level at input terminal 121 is equal to the voltage level of bit line voltage VBL reduced by a voltage drop based on a resistance of the path between bit line BL and input terminal 121.

Memory circuit 100, or a memory macro including memory circuit 100, is configured so that the cell voltage has first programming voltage level corresponding to setting memory cell 120 to the LRS in a first write operation, a second programming voltage level corresponding to resetting memory cell 120 to the HRS in a second write operation, and a read voltage level corresponding to detecting the LRS or HRS in a read operation. In each of the first and second write operations and the read operation, the cell voltage applied to memory cell 120 causes current Ic to flow into input terminal 121 and out of output terminal 122.

Current source 130 is an electronic circuit configured to receive a power supply voltage VDD from power supply node VDDN, and to generate current I1. In the embodiment depicted in FIG. 1, power supply voltage VDD is an operating voltage having the operating voltage level of memory circuit 100. In some embodiments, current source 130 is coupled between bias voltage generator 140 and a power supply reference node (not shown) configured to carry a power supply reference voltage having the power supply reference voltage level, e.g., a ground voltage level, of memory circuit 100. In some embodiments, current source 130 is included in bias voltage generator 140.

Current source 130 is configured to generate current I1 having one or more predetermined current levels. In some embodiments, at least one predetermined current level is based on a compliance level of memory cell 120 in a write operation, the compliance level being a maximum current level designed to avoid an undesirable condition, e.g., an overheating and/or damaging stress level, or performance of an unreliable programming operation.

In various embodiments, current source 130 is configured to generate current I1 having a predetermined current level equal to a compliance level or to another level derived from the compliance level, e.g., a multiple or fraction of the compliance level.

Bias voltage generator 140 is an electronic circuit that includes an input terminal 141 configured to receive current I1, an input terminal 143 configured to receive a reference voltage VR1, an input terminal 145 configured to receive a signal EN, and an output terminal 142 configured to carry bias voltage VB. Bias voltage generator 140 includes a power supply reference node (not shown) configured to carry the power supply reference voltage and is thereby configured to conduct current I1 from input terminal 141 to the power supply reference node. In some embodiments, bias voltage generator 140 is bias voltage generator 400 discussed below with respect to FIG. 4.

Bias voltage generator 140 is configured to generate bias voltage VB responsive to current I1, reference voltage VR1, and signal EN, and to output bias voltage VB to output terminal 142. Bias voltage VB has a bias voltage level based on a reference voltage level of reference voltage VR1 and the current level of current I1. The bias voltage level of bias voltage VB and the reference voltage level of reference voltage VR1 are defined relative to the power supply reference voltage level of the power supply reference voltage.

In some embodiments, bias voltage generator 140 is configured to generate bias voltage VB having the bias voltage level based on maintaining a voltage level at input terminal 141 at the reference voltage level of reference voltage VR1 while receiving current I1 having the current level. In some embodiments, bias voltage generator 140 includes a transistor, e.g., a transistor N1 discussed below with respect to FIG. 4, configured to conduct current I1, and is thereby configured to generate bias voltage VB having the bias voltage level corresponding to a gate voltage of the transistor. In some embodiments, bias voltage generator 140 is configured to generate the bias voltage level as the gate voltage of the transistor required to maintain the voltage level at input terminal 141 at the reference voltage level of reference voltage VR1.

In some embodiments, bias voltage generator 140 is configured to receive reference voltage VR1 having the reference voltage level ranging from 0.08 volts (V) to 0.3 V. In some embodiments, bias voltage generator 140 is configured to receive reference voltage VR1 having the reference voltage level equal to approximately 0.1 V.

In some embodiments, bias voltage generator 140 is configured to receive current I1 having the current level ranging from 50 microamperes (μA) to 500 μA. In some embodiments, bias voltage generator 140 is configured to receive current I1 having the current level ranging from 150 μA to 250 μA.

Bias voltage generator 140 is configured to generate bias voltage VB having the bias voltage level based on signal EN having one of the high or low logical states, and when signal EN has the other of the high or low logical states, generate bias voltage VB having a voltage level other than the bias voltage level, e.g., the operating or ground voltage level.

In some embodiments, bias voltage generator 140 does not include input terminal 145 and is configured to conditionally generate bias voltage VB having the bias voltage level based solely on the reference voltage level of reference voltage VR1, e.g., based on the reference voltage level of reference voltage VR1 being less than, greater than, or equal to a predetermined value, or within a predetermined range of values.

By being based on the reference voltage level of reference voltage VR1 and the current level of current I1 as discussed above, the bias voltage level of bias voltage VB includes information usable to control a current other than current I1 based on the reference voltage level of reference voltage VR1 and the current level of current I1.

In some embodiments, memory circuit 100 does not include current source 130 and bias voltage generator 140, and is otherwise configured to generate or receive bias voltage VB having a bias voltage level usable to control a current other than current I1 based on the reference voltage level of reference voltage VR1 and the current level of current I1. In some embodiments, memory circuit 100 is one memory circuit of a plurality of memory circuits (not shown), e.g., corresponding to a word in a memory array, and each memory circuit of the plurality of memory circuits is configured to receive bias voltage VB generated by a single bias voltage generator 140.

Current limiter 150 is an electronic circuit that includes input terminal 151 configured to receive current Ic, an input terminal 153 configured to receive bias voltage VB, and an input terminal 155 configured to receive a reference voltage VR2. Current limiter 150 includes a power supply reference node (not shown) configured to carry the power supply reference voltage and is thereby configured to conduct current Ic from input terminal 151 to the power supply reference node. In some embodiments, current limiter 150 is current limiter 500 discussed below with respect to FIGS. 5A-5C.

Current limiter 150 is configured to limit current Ic to current limit levels responsive to voltage levels of voltage VD at input terminal 151, the bias voltage level of bias voltage VB, and a reference voltage level of reference voltage VR2. The voltage levels of voltage VD and the reference voltage level of reference voltage VR2 are defined relative to the power supply reference voltage level of the power supply reference voltage.

The current limit levels of current Ic include first current limit levels, second current limit levels, and in some embodiments, a third current limit level. The first current limit levels correspond to voltage levels of voltage VD at or below the reference voltage level of reference voltage VR2; the second current limit levels correspond to voltage levels of voltage VD above the reference voltage level of reference voltage VR2; and the third current limit level corresponds to a predefined delay period following a voltage level of voltage VD crossing above the reference voltage level of reference voltage VR2.

Current limiter 150 is configured to vary each of the first and second current limit levels as a function of the voltage levels of voltage VD. Each functional relationship between the first current limit levels and the voltage levels and between the second current limit levels and the voltage levels is based on the bias voltage level of bias voltage VB and has a positive slope. In some embodiments, each functional relationship is determined, at least in part, by a channel conductance of a transistor coupled between input terminal 151 and the power supply reference node, e.g., a transistor N3 discussed below with respect to FIGS. 5A and 5B, based on the bias voltage level of bias voltage VB at the gate of the transistor.

In operation, the voltage level of voltage VD being at the reference voltage level of reference voltage VR2 causes current limiter 150 to limit current Ic to a maximum first current limit level. As the voltage level of voltage VD crosses above the reference voltage level of reference voltage VR2, current limiter 150 is configured to limit current Ic to a minimum second current limit level lower than the maximum first current limit level. In some embodiments, the minimum second current limit level is less than half of the maximum first current limit level.

In various embodiments, current limiter 150 is configured to receive reference voltage VR2 having the reference voltage level less than, equal to, or greater than the reference voltage level of reference voltage VR1 received by bias voltage generator 140. In some embodiments, current limiter 150 is configured to receive reference voltage VR2 having the reference voltage level ranging from 0.08 volts (V) to 0.3 V. In some embodiments, current limiter 150 is configured to receive reference voltage VR2 having the reference voltage level equal to approximately 0.1 V.

In some embodiments, current limiter 150 is configured to limit current Ic to the first and second current limit levels ranging from less than 50 microamperes (μA) to 500 μA. In some embodiments, current limiter 150 is configured to limit current Ic to the first and second current limit levels ranging from less than 50 μA to 250 μA.

In some embodiments, current limiter 150 is configured to limit current Ic to the third current limit level based on the predefined delay period ranging from 100 nanoseconds (ns) to 1000 ns. In some embodiments, current limiter 150 is configured to limit current Ic to the third current limit level based on the predefined delay period ranging from 300 ns to 700 ns.

In some embodiments, current limiter 150 includes a plurality of current paths, each including a switching device, e.g., current path P1 including transistor N5 and current path P2 including transistor N6 discussed below with respect to FIGS. 5A-5C, and is thereby configured to limit current Ic to the first current limit levels by causing each current path of the plurality of current paths to conduct a corresponding portion of current Ic, and limit current Ic to the second current limit levels by causing a first subset of the plurality of current paths to conduct corresponding portions of current Ic. Because the second current limit levels are determined by fewer current paths than are used to determine the first current limit levels, the second current limit levels are based on higher resistance levels than those corresponding to the first current limit levels.

In some embodiments, current limiter 150 includes one or more conductive devices (not shown), e.g., one or more resistors and/or transistors, in a single current path between input terminal 151 and the power supply reference node and is configured to limit current Ic to the first and second current limit levels by controlling the one or more conductive devices so as to alter resistance levels of the single current path.

In some embodiments, current limiter 150 is configured to, following the predefined delay period, limit current Ic to the third current limit level lower than the second current limit level corresponding to a given voltage level of voltage VD. In some embodiments, the third current limit level corresponds to an open circuit configuration and is approximately zero amperes.

In some embodiments, current limiter 150 includes the plurality of transistors and is thereby configured to limit current Ic to the third current limit level by causing a second subset of the plurality of transistors to conduct corresponding portions of current Ic, the second subset being smaller than the first subset. In some embodiments, the second subset is zero transistors of the plurality of transistors and current limiter 150 is thereby configured to limit current Ic to the third current limit level by preventing an entirety of the plurality of transistors from conducting current Ic.

In some embodiments, current limiter 150 includes an output terminal (not shown) and is configured to generate a signal, e.g., a signal SW1 or SW2 discussed below with respect to FIGS. 5A and 5B, at the output terminal, the signal having either a first logical state (one of the high or low logical states) or a second logical state (the other of the high or low logical states). The first logical state corresponds to voltage levels of voltage VD below or at the reference voltage level of reference voltage VR2, and the second logical state corresponds to voltage levels of voltage VD above the reference voltage level of reference voltage VR2. In some embodiments, the first logical state further corresponds to voltage levels of voltage VD above the reference voltage level of reference voltage VR2 until the predefined delay period has elapsed, and the second logical state corresponds to voltage levels of voltage VD above the reference voltage level of reference voltage VR2 following the predefined delay period.

In such embodiments, at least one of selection circuit 110, memory cell 120, current source 130, bias voltage generator 140, or another circuit component (not shown) is configured to receive the signal and, responsive to the signal having the second logical state, limit current Ic to the third current limit level, e.g., by altering the bias voltage level of bias voltage VB or interrupting a current path of current Ic by opening a switch. In some embodiments, the at least one of selection circuit 110, memory cell 120, current source 130, bias voltage generator 140, or other circuit component is configured to limit current Ic to the third current limit level responsive to the signal having the second logical state following the predefined delay period.

In the embodiments in which current limiter 150 is configured to generate the signal at the output terminal, memory circuit 100 and current limiter 150 are thereby configured to limit current Ic to the third current limit level lower than the second current limit level following the predefined delay period.

By the configuration discussed above, memory circuit 100 is capable of limiting current Ic through memory cell 120 based on voltages VD, VR2, and VB. By responding to the voltage level of voltage VD, memory circuit 100 is capable of dynamically limiting current Ic during an RRAM programming operation, e.g., forming a filament, in memory cell 120. Memory circuit 100 thereby operates to reduce voltage and current in memory cell 120 once current Ic reaches a predetermined level as determined by reference voltage VR2 and bias voltage VB.

Memory circuit 100 is thereby configured to avoid overstress conditions during programming operations on memory cell 120 so that programming reliability is improved compared to approaches in which memory cell voltage and current are not reduced once a predetermined RRAM current is reached.

In embodiments in which memory circuit 100 is configured to further limit current Ic after the predefined delay period, memory circuit 100 thereby enables control of filament growth to improve data retention compared to approaches in which RRAM current is not further limited or switched off after a predefined delay period once a predetermined current is reached.

Figure 2A:
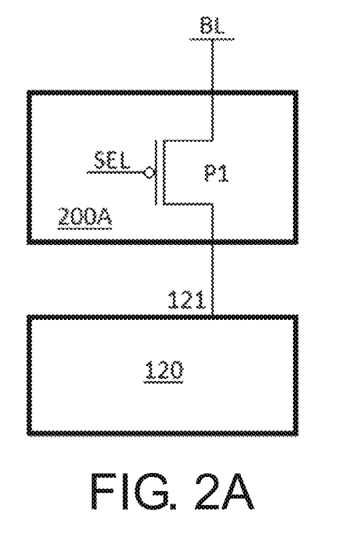
FIGS. 2A and 2B are diagrams of selection circuits, in accordance with some embodiments.
Figure 2B:
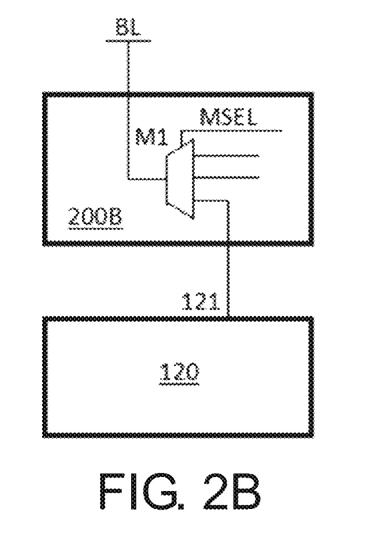

FIGS. 2A and 2B are diagrams of respective selection circuits 200A and 200B, in accordance with some embodiments. Each of selection circuits 200A and 200B is usable as some or all of selection circuit 110, discussed above with respect to FIG. 1. In addition to respective selection circuits 200A and 200B, FIGS. 2A and 2B depict bit line BL and memory cell 120, each discussed above with respect to FIG. 1.

Selection circuit 200A includes a transistor P1 including a gate configured to receive a signal SEL, a source/drain terminal coupled to bit line BL and a source/drain terminal coupled to input terminal 121 of memory cell 120. Selection circuit 200A is thereby configured to couple bit line BL to input terminal 121 responsive to signal SEL having one of the high or low logical states, and decouple bit line BL from input terminal 121 responsive to signal SEL having the other of the high or low logical states.

In the embodiment depicted in FIG. 2A, transistor P1 is a p-type transistor configured to couple bit line BL to input terminal 121 in response to signal SEL having the low logical state. In some embodiments, transistor P1 is an n-type transistor configured to couple bit line BL to input terminal 121 response to signal SEL having the high logical state.

Selection circuit 200B includes a multiplexer M1 including an input terminal (not labeled) configured to receive one or more signals MSEL, an input terminal (not labeled) coupled to bit line BL, and a plurality of output terminals (not labeled), one of which is coupled to input terminal 121 of memory cell 120. Selection circuit 200B is thereby configured to couple bit line BL to input terminal 121 responsive to a first logical state of the one or more signals MSEL, and decouple bit line BL from input terminal 121 responsive to one or more other logical states of the one or more signals MSEL different from the first logical state of the one or more signals MSEL.

By being included in memory circuit 100 discussed above with respect to FIG. 1, each of selection circuits 200A and 200B operates to achieve the benefits discussed above with respect to memory circuit 100.

Figure 3A:
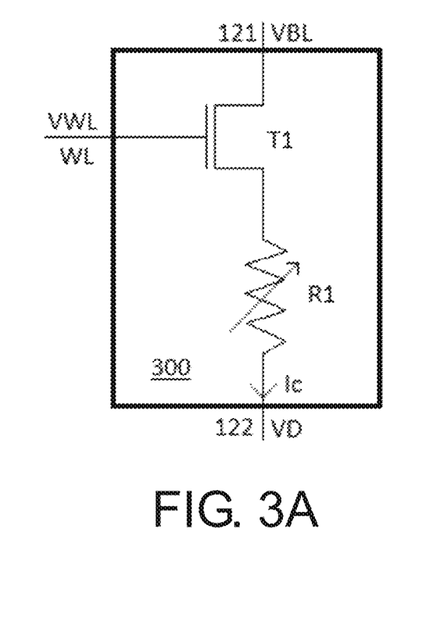
FIG. 3A is a diagram of an RRAM device, in accordance with some embodiments.

FIG. 3A is a diagram of RRAM device 300, in accordance with some embodiments. RRAM device 300 is usable as part or all of memory cell 120, discussed above with respect to FIG. 1. RRAM device 300 includes input terminal 121 configured to carry bit line voltage VBL and output terminal 122 configured to carry voltage VD, each discussed above with respect to FIG. 1, and a switching device T1 coupled in series with a variable resistance structure R1. In the embodiment depicted in FIG. 3, switching device T1 is coupled between input terminal 121 and variable resistance structure R1. In some embodiments, switching device T1 is coupled between output terminal 122 and variable resistance structure R1.

Switching device T1 includes a control terminal, e.g., a transistor gate, coupled to a word line WL configured to carry a word line signal VWL. RRAM device 300 is thereby configured to provide a current path from input terminal 121 to output terminal 122 that includes variable resistance structure R1 responsive to signal VWL having one of the high or low logical states, and interrupt the current path responsive to signal VWL having the other of the high or low logical states.

In the embodiment depicted in FIG. 3A, switching device T1 is an n-type transistor configured to provide the current path from input terminal 121 to output terminal 122 in response to signal VWL having the high logical state. In some embodiments, switching device T1 is a p-type transistor configured to provide the current path from input terminal 121 to output terminal 122 in response to signal VWL having the low logical state. In some embodiments, RRAM device 300 does not include switching device T1 and is externally controlled so as to selectively provide the current path responsive to signal VWL.

Figure 3B:
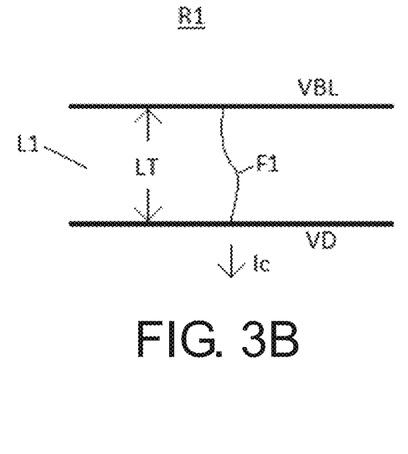
FIG. 3B is a diagram of a variable resistance structure, in accordance with some embodiments.

FIG. 3B is a diagram of variable resistance structure R1, in accordance with some embodiments. Variable resistance structure R1 is a microelectronic structure that includes a resistive layer L1 having a thickness LT. In addition to resistive layer L1, variable resistance structure R1 includes one or more features, e.g., conductive elements, that are not depicted in FIG. 3B for the purpose of clarity. In a programming operation, a voltage difference across resistive layer L1 based on voltages VBL and VD induces formation of a filament F1, thereby providing a current path for current Ic.

Resistive layer L1 is one or more layers of dielectric materials configured to receive the voltage difference across thickness LT. In various embodiments, resistive layer L1 includes one or more of an oxide of tungsten (W), tantalum (Ta), titanium (Ti), nickel (Ni), cobalt (Co), hafnium (Hf), ruthenium (Ru), zirconium (Zr), zinc (Zn), iron (Fe), tin (Sn), aluminum (Al), copper (Cu), silver (Ag), molybdenum (Mo), chromium (Cr), or another suitable element, a composite material including, e.g., silicon, or another material capable of having either the HRS or LRS. In some embodiments, resistive layer L1 has thickness LT ranging from 20 nanometers (nm) to 100 nm.

Based on the presence or absence of filament F1, resistive layer L1 has either the LRS or HRS, respectively, as discussed above with respect to memory cell 120 and FIG. 1. In the embodiment depicted in FIG. 3B, resistive layer L1 includes a single filament F1, and thereby a single current path through which current Ic flows, in operation. In various embodiments, resistive layer L1 includes one or more filaments (not shown) in addition to filament F1, and thereby a plurality of current paths through which current Ic flows, in operation.

In various embodiments, resistive layer L1 has a resistance value ranging from 1 kilo-ohm (kΩ) to 4 kΩ in the LRS and/or a resistance value ranging from 15 kΩ to 30 kΩ in the HRS. In various embodiments, resistive layer L1 has a first range of resistance values in the LRS and a second range of resistance values in the HRS, and a difference between a maximum value of the first range and a minimum value of the second range is greater than the maximum value of the first range multiplied by 0.05 (at least 5% greater than the maximum value of the first range).

RRAM device 300 is thereby configured to, in operation, generate current Ic, when signal VWL has the corresponding high or low logical state, based on a difference between the voltage levels of bit line voltage VBL at input terminal 121, and voltage VD at output terminal 122, and the resistance value of resistive layer L1.

By being included in memory circuit 100 discussed above with respect to FIG. 1, RRAM device 300 operates to achieve the benefits discussed above with respect to memory circuit 100.

Figure 4:
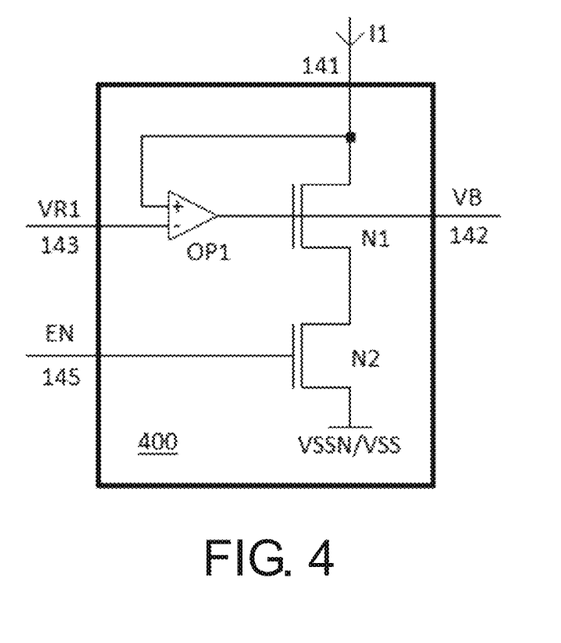
FIG. 4 is a diagram of a bias voltage generator, in accordance with some embodiments.

FIG. 4 is a diagram of bias voltage generator 400, in accordance with some embodiments. Bias voltage generator 400 is usable as part or all of bias voltage generator 140, discussed above with respect to FIG. 1.

Bias voltage generator 400 includes input terminals 141, 143, and 145, and output terminal 142, each discussed above with respect to FIG. 1, and is thereby configured to receive current I1. In some embodiments, bias voltage generator 400 does not include input terminal 141 and instead includes current source 130 and optionally power supply voltage node VDDN, each discussed above with respect to FIG. 1, and is thereby configured to generate current I1.

In addition to input terminals 141, 143, and 145, and output terminal 142, bias voltage generator 400 includes a power supply reference node VSSN, transistors N1 and N2 coupled in series between input terminal 141 and power supply reference node VSSN, and an amplifier OP1 coupled between input terminal 143 and transistor N1. Power supply reference node VSSN is configured to carry a power supply reference voltage VSS having the power supply reference voltage level of bias voltage generator 400. In some embodiments, the power supply reference voltage level of bias voltage generator 400 is the power supply reference voltage level of memory circuit 100.

Transistor N2 has a gate coupled to input terminal 145 and is thereby configured to receive signal EN, discussed above with respect to FIG. 1. Transistor N2 has a source/drain terminal coupled to power supply reference node VSSN, and a source/drain terminal coupled to a source/drain terminal of transistor N1. Transistor N2 is thereby configured to provide a current path from input terminal 141 to power supply reference node VSSN that includes transistor N1 responsive to signal EN having one of the high or low logical states, and interrupt the current path responsive to signal EN having the other of the high or low logical states.

In the embodiment depicted in FIG. 4, transistor N2 is an n-type transistor configured to provide the current path in response to signal EN having the high logical state. In some embodiments, transistor N2 is a p-type transistor configured to provide the current path in response to signal EN having the low logical state. In the embodiment depicted in FIG. 4, transistor N2 is coupled between transistor N1 and power supply reference node VSSN. In some embodiments, transistor N2 is coupled between transistor N1 and input terminal 141.

In addition to the source/drain terminal coupled to the source/drain terminal of transistor N2, transistor N1 has a source/drain terminal coupled to input terminal 141 and a gate coupled to an output terminal of amplifier OP1. In the embodiment depicted in FIG. 4, transistor N1 is an n-type transistor. In some embodiments, transistor N1 is a p-type transistor.

Amplifier OP1 is an operational amplifier having an inverting input terminal coupled to input terminal 143 and is thereby configured to receive reference voltage VR1, discussed above with respect to FIG. 1, and a non-inverting input terminal coupled to input terminal 141 and the source/drain terminal of transistor N1. In addition to being coupled to the gate of transistor N1, the output terminal of amplifier OP1 is coupled to output terminal 142, and bias voltage generator 140 is thereby configured to output bias voltage VB to output terminal 142.

By the configuration discussed above, amplifier OP1 and transistor N1 form a closed loop that, in operation, causes amplifier OP1 to modulate the gate of N1, and thereby bias voltage VB, so as to sustain the current level of current I1 and maintain the source/drain node of transistor N1 coupled to input terminal 141 at the reference voltage level of reference voltage VR1. Because the voltage required to maintain a given current level of current I1 is determined in part by dimensions of transistor N1, the bias voltage level of bias voltage VB is based on the dimensions of transistor N1.

Bias voltage generator 400 is thereby configured to generate bias voltage VB based on the reference voltage level of reference voltage VR1, the current level of current I1, and the dimensions of transistor N1 such that the bias voltage level of bias voltage VB includes information usable to control a current other than current I1 based on the reference voltage level of reference voltage VR1 and the current level of current I1.

By being included in memory circuit 100 discussed above with respect to FIG. 1, bias voltage generator 400 operates to achieve the benefits discussed above with respect to memory circuit 100.

Figure 5A:
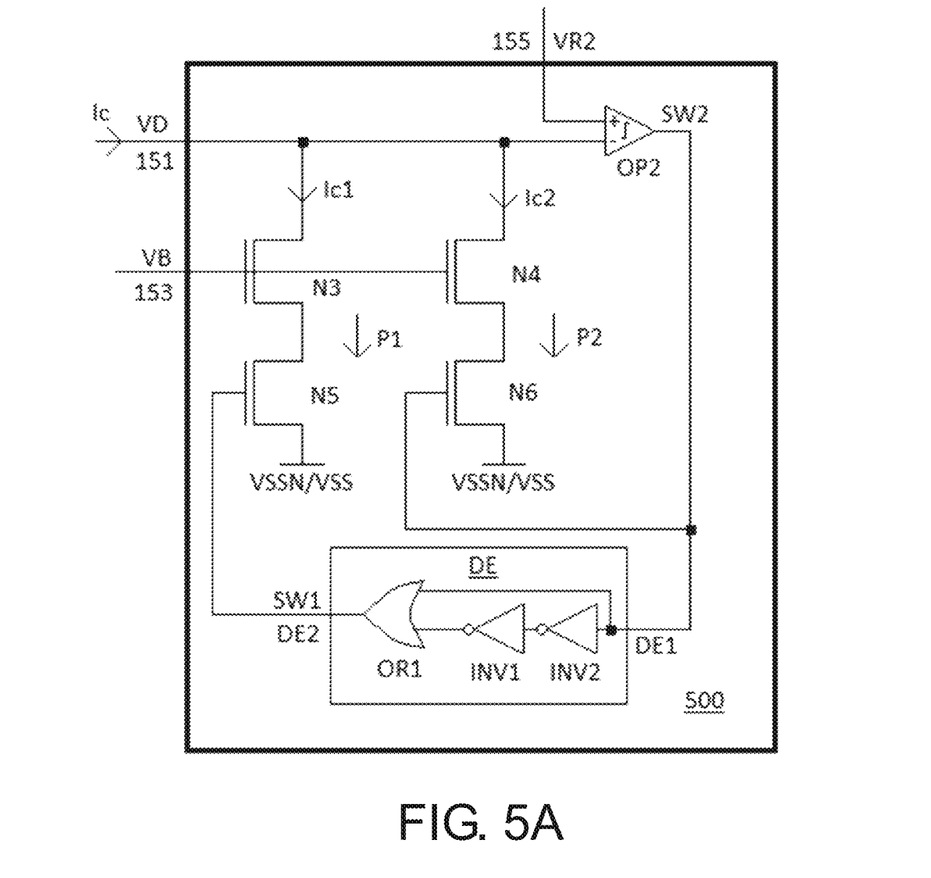
FIG. 5A is a diagram of a current limiter, in accordance with some embodiments.

FIG. 5A is a diagram of current limiter 500, in accordance with some embodiments. Current limiter 500 is usable as part or all of current limiter 150, discussed above with respect to FIG. 1. Current limiter 500 includes input terminals 151, 153, and 155, each discussed above with respect to and FIG. 1, power supply reference node VSSN discussed above with respect to FIG. 4, transistors N3 and N4, switching devices N5 and N6, an amplifier OP2, and a delay element DE. A programming operation using current limiter 500 is discussed below with respect to FIGS. 5B and 5C.

Current limiter 500 includes current paths P1 and P2. Current path P1 includes transistor N3 and switching device N5 coupled in series between input terminal 151 and power supply reference node VSSN, and current path P2 includes transistor N4 and switching device N6 coupled in series between input terminal 151 and power supply reference node VSSN. Each of transistors N3 and N4 has a gate coupled to input terminal 153 and is thereby configured to receive bias voltage VB. In the embodiment depicted in FIG. 5A, each of transistors N3 and N4 is an n-type transistor. In various embodiments, one or both of transistors N3 or N4 is a p-type transistor.

Amplifier OP2 is a comparator having an inverting input terminal coupled to input terminal 151 and a source/drain terminal of each of transistors N3 and N4, and a non-inverting input terminal coupled to input terminal 155, and is thereby configured to receive reference voltage VR2. Amplifier OP2 has an output terminal coupled to a control terminal, e.g., a transistor gate, of switching device N6 and to an input terminal DE1 of delay element DE. Delay element DE has an output terminal DE2 coupled to a control terminal, e.g., a transistor gate, of switching device N5. Amplifier OP2 is thereby configured to output signal SW2 to switching device N6 and delay element DE responsive to the reference voltage level of reference voltage VR2 and the voltage level of voltage VD at input terminal 151.

In the embodiment depicted in FIG. 5A, amplifier OP2 is configured to output signal SW2 having the high logical state in response to receiving the voltage level of voltage VD less than or equal to the reference voltage level of reference voltage VR2, and output signal SW2 having the low logical state in response to receiving the voltage level of voltage VD greater than the reference voltage level of reference voltage VR2. In some embodiments, amplifier OP2 is configured to output signal SW2 having the low logical state in response to receiving the voltage level of voltage VD less than or equal to the reference voltage level of reference voltage VR2, and output signal SW2 having the high logical state in response to receiving the voltage level of voltage VD greater than the reference voltage level of reference voltage VR2.

Delay element DE is an electronic circuit or device configured to receive signal SW2 at input terminal DE1, and generate signal SW1 at output terminal DE2 such that a transition in signal SW2 from a first logical state (one of the high or low logical states) to a second logical state (the other of the high or low logical states) causes delay element DE to generate a transition in signal SW1 following a predefined delay period. In various embodiments, delay element DE is configured to generate the transition in signal SW1 either from the first logical state to the second logical state or from the second logical state to the first logical state following the predefined delay period.

In the embodiment depicted in FIG. 5A, delay element DE includes inverters INV1 and INV2 and an OR gate OR1 coupled in series between input terminal DE1 and output terminal DE2. Input terminals of inverter INV2 and OR gate OR1 are coupled to input terminal DE1, an output terminal of OR gate OR1 is coupled to output terminal DE2, and an input terminal of OR gate OR1 is coupled to an output terminal of inverter INV1.

In the embodiment depicted in FIG. 5A, delay element DE is configured to respond to a transition in signal SW2 from the high logical state to the low logical state by generating signal SW1 having the transition from the high logical state to the low logical state following the predefined delay period based on switching speeds of inverters INV1 and INV2. In various embodiments, delay element DE does not include one or more of inverters INV1 and/or INV2 and/or OR gate OR1, and/or includes one or more other circuit elements (not shown), e.g., inverters, non-inverting buffers, or logic gates, suitable for applying a predefined delay period.

Switching devices N5 and N6 have conduction terminals, e.g., transistor source/drain terminals, coupled to corresponding source/drain terminals of transistors N3 and N4, and conduction terminals coupled to power supply reference node VSSN. Switching device N5 is thereby configured to provide a conduction path within current path P1 responsive to signal SW1 having one of the high or low logical states, and interrupt current path P1 responsive to signal SW1 having the other of the high or low logical states. In the embodiment depicted in FIG. 5A, switching device N5 is coupled between transistor N3 and power supply reference node VSSN. In some embodiments, switching device N5 is coupled between transistor N3 and input terminal 151.

In the embodiment depicted in FIG. 5A, switching device N5 is an n-type transistor configured to provide the conduction path within current path P1 in response to signal SW1 having the high logical state. In some embodiments, switching device N5 a p-type transistor configured to provide the conduction path within current path P1 in response to signal SW1 having the low logical state.

Switching device N6 is thereby configured to provide a conduction path within current path P2 responsive to signal SW2 having one of the high or low logical states, and interrupt current path P2 responsive to signal SW2 having the other of the high or low logical states. In the embodiment depicted in FIG. 5A, switching device N6 is coupled between transistor N4 and power supply reference node VSSN. In some embodiments, switching device N6 is coupled between transistor N4 and input terminal 151.

In the embodiment depicted in FIG. 5A, switching device N6 is an n-type transistor configured to provide the conduction path within current path P2 in response to signal SW2 having the high logical state. In some embodiments, switching device N6 is a p-type transistor configured to provide the conduction path within current path P2 in response to signal SW2 having the low logical state.

Current limiter 500 is thereby configured to, in operation, limit current Ic, received at input terminal 151, based on combinations of a current Ic1 that flows through current path P1 to power supply reference node VSSN in response to switching device N5 being switched on by signal SW1, and a current Ic2 that flows through current path P2 to power supply reference node VSSN in response to switching device N6 being switched on by signal SW2.

In operation, when voltage levels of voltage VD are less than or equal to the reference voltage level of reference voltage VR2, for a duration at least as long as the predefined delay period in some embodiments, amplifier OP2 generates signal SW2 having the high logical state, thereby switching on transistor N6, and delay element DE generates signal SW1 having the high logical state, thereby switching on switching device N5. Current limiter 500 is thereby configured to limit current Ic to the first current limit levels, discussed above with respect to current limiter 150 and FIG. 1, based on a sum of current Ic1, controlled by transistor N3, and current Ic2, controlled by transistor N4, as discussed below.

In operation, when voltage levels of voltage VD are greater than the reference voltage level of reference voltage VR2, for a duration shorter than the predefined delay period in some embodiments, amplifier OP2 generates signal SW2 having the low logical state, thereby switching off switching device N6, and delay element DE generates signal SW1 having the high logical state, thereby switching on switching device N5. Current limiter 500 is thereby configured to limit current Ic to the second current limit levels, discussed above with respect to current limiter 150 and FIG. 1, based solely on current Ic1, controlled by transistor N3, as discussed below.

In operation, when voltage levels of voltage VD are greater than the reference voltage level of reference voltage VR2 for a duration at least as long as the predefined delay period in some embodiments, amplifier OP2 generates signal SW2 having the low logical state, thereby switching off switching device N6, and delay element DE generates signal SW1 having the low logical state, thereby switching off switching device N5. Current limiter 500 is thereby configured to limit current Ic to the third current limit level, discussed above with respect to current limiter 150 and FIG. 1, corresponding to an open circuit configuration and having a value of approximately zero amperes.

Current levels of currents Ic1 and Ic2 vary as a function of voltage VD based on the bias voltage level of bias voltage VB received at the gates of respective transistors N3 and N4. In some embodiments, current limiter 500 is configured to receive bias voltage VB having the bias voltage level corresponding to each of transistors N3 and N4 operating in the linear region. Each of transistors N3 and N4 operating in the linear region causes current levels of currents Ic1 and Ic2 to increase as a function of voltage VD until saturation current levels of respective transistors N3 and N4 are reached.

Figure 5B:
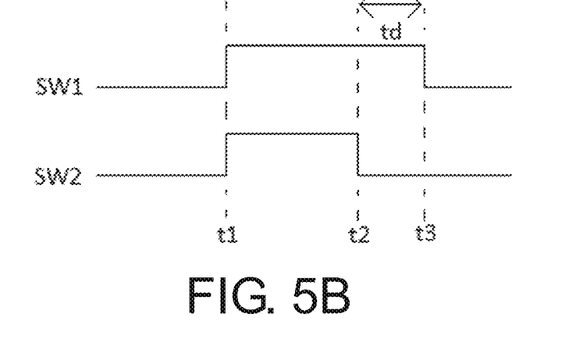
FIGS. 5B and 5C are plots of current limiter operating parameters, in accordance with some embodiments.
Figure 5C:
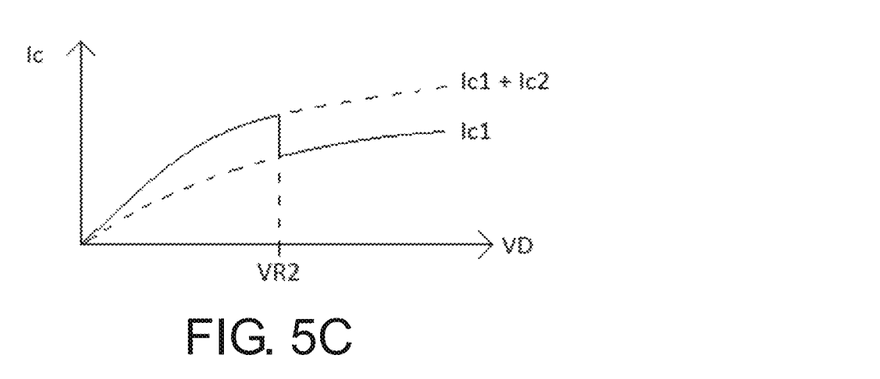

FIGS. 5B and 5C are plots of current limiter 500 operating parameters during a programming operation, in accordance with some embodiments. FIG. 5B is a plot of signals SW1 and SW2 as a function of time, and FIG. 5C is a plot of current Ic as a function of voltage VD, in accordance with some embodiments.

FIG. 5B depicts signals SW1 and SW2 in relation to times t1, t2, and t3, and includes a predefined delay period td corresponding to a period from time t2 to time t3. FIG. 5C depicts a dashed curve corresponding to current Ic1, a dashed curve corresponding to currents Ic1+Ic2, and a solid curve corresponding to current Ic. Voltage levels of voltage VD less than or equal to the reference voltage level of reference voltage VR2 correspond to the first current limit levels, and voltage levels of voltage VD greater than the reference voltage level of reference voltage VR2 correspond to the second current limit levels.

Time t1 corresponds to an initial state of the programming operation prior to bit line voltage VBL having a programming voltage level corresponding to setting a memory cell, e.g., memory cell 120 discussed above with respect to FIG. 1, to the LRS. Thus, at time t1, voltage VD has a voltage level below the reference voltage level of reference voltage VR2, each of signals SW1 and SW2 has the high logical state, each of switching devices N5 and N6 is switched on, and current Ic is limited to the first current limit levels determined by currents Ic1+Ic2 through respective transistors N3 and N4.

Between times t1 and t2, a voltage level of bit line voltage VBL is increased to the programming voltage level, thereby causing the voltage level of voltage VD to increase such that the first current limit levels increase along the solid curve in FIG. 5C corresponding to currents Ic1+Ic2.

Time t2 corresponds to the point at which the voltage level of voltage VD crosses above the reference voltage level of reference voltage VR2. At time t2, signal SW2 transitions from the high logical state to the low logical state, switching device N6 is switched off, and current Ic transitions from being limited based on currents Ic1+Ic2 to being limited based solely on current Ic1, indicated by the vertical portion of the solid curve at reference voltage VR2 in FIG. 5C. Thus, at time t2, the current level of current Ic is reduced from the sum of currents Ic1+Ic2 to the current level of Ic1 only.

Between times t2 and t3, current Ic remains limited to the second current limit levels determined by current Ic1 through transistor N3, as indicated by the solid curve in FIG. 5C corresponding to current Ic1.

In some embodiments, current Ic being limited to current Ic1 causes transistor N3 to operate in the saturation region, indicated by the nearly horizontal portion of the solid curve corresponding to current Ic1, thereby causing voltage VD to further increase. As voltage VD increases, the voltage difference across a memory cell, e.g., memory cell 120 discussed above with respect to FIG. 1, decreases, thereby reducing a stress level on the RRAM device, e.g., RRAM device 300 discussed above with respect to FIGS. 3A and 3B.

Time t3 follows time t2 by the period corresponding to predefined delay period td, at which point signal SW1 transitions from the high logical state to the low logical state, thereby switching off switching device N5.

From time t3 until an end of the programming operation (not shown), each of transistors N5 and N6 is switched off, current limiter 500 is configured as an open circuit at input terminal 151, and current Ic is limited to a current level of approximately zero amperes.

Through currents Ic1 and Ic2, current limiter 500 is thereby configured to limit current Ic to each of the first, second, and third current limit levels in the programming operation based on the voltage level of voltage VD, the bias voltage level of bias voltage VB, and the reference voltage level of reference voltage VR2.

For a given bias voltage level of bias voltage VB and a given voltage level of voltage VD, the current levels of currents Ic1 and Ic2 are determined by dimensions of transistors N3 and N4, respectively. In some embodiments, transistors N3 and N4 have dimensions configured so that, for the given bias voltage level of bias voltage VB and the voltage level of voltage VD equal to the reference voltage level of reference voltage VR2, the current level of current Ic1 is less than the current level of current Ic2 such that current Ic is reduced by more than one half at time t2.

In various embodiments, transistors N3 and N4 have dimensions configured so that, for the given bias voltage level of bias voltage VB and the voltage level of voltage VD equal to the reference voltage level of reference voltage VR2, the current level of current Ic1 is equal to or greater than the current level of current Ic2 such that current Ic is reduced by one half or less at time t2.

For the given bias voltage level of bias voltage VB and voltage levels of voltage VD less than or equal to the reference voltage level of reference voltage VR2, the first current limit levels are determined by the dimensions of transistors N3 and N4 in combination.

In some embodiments, transistors N3 and N4 have dimensions configured so that, for the given bias voltage level of bias voltage VB and the voltage level of voltage VD equal to the reference voltage level of reference voltage VR2, the first current limit level is approximately equal to current I1 discussed above with respect to FIG. 1. In such embodiments, current limiter 500 is thereby configured to limit current Ic to the maximum first current limit level approximately equal to current I1 based on the bias voltage level of bias voltage VB discussed above with respect to FIG. 1. In some such embodiments, current limiter 500 is thereby configured to limit current Ic to the maximum first current limit level approximately equal to current I1 based on the dimensions of transistors N3 and N4 combined with the dimensions of transistor N1 discussed above with respect to bias voltage generator 400 and FIG. 4. In some such embodiments, current limiter 500 is thereby configured to limit current Ic to the maximum first current limit level approximately equal to current I1 corresponding to a compliance level of a memory cell, e.g., memory cell 120 discussed above with respect to FIG. 1, including an RRAM device, e.g., RRAM device 300 discussed above with respect to FIGS. 3A and 3B.

In some embodiments, transistors N1, N3, and N4 have a combination of dimensions such that bias voltage generator 400 and current limiter 500 are configured to limit current Ic to the maximum first current limit level having a relationship to current I1 other than equality, e.g., a multiple or fraction of current I1, based on the bias voltage level of bias voltage VB. In some such embodiments, current limiter 500 is thereby configured to limit current Ic to the maximum first current limit level approximately equal to a compliance level of a memory cell, e.g., memory cell 120 discussed above with respect to FIG. 1, including an RRAM device, e.g., RRAM device 300 discussed above with respect to FIGS. 3A and 3B, based on the maximum first current limit level having a predetermined relationship to current I1, e.g., a multiple or fraction of current I1.

In some embodiments, current limiter 500 does not include switching device N5 in current path P1, and instead includes an output terminal (not shown), and is configured to output signal SW1 to the output terminal, as discussed above with respect to FIG. 1. In some embodiments, current limiter 500 does not include switching device N5 in current path P1, or delay element DE1, and instead includes the output terminal and is configured to output signal SW2 to the output terminal, as discussed above with respect to FIG. 1.

By being included in memory circuit 100 discussed above with respect to FIG. 1, current limiter 500 operates to achieve the benefits discussed above with respect to memory circuit 100. Based on the configuration discussed above, current limiter 500 is further capable of limiting current Ic based on voltage levels of voltage VD below those used in other current limiting approaches, e.g., diode-based circuits, and thereby operates to limit current, e.g., during RRAM programming operations, with lower voltage overhead than in other such approaches.

Figure 6:
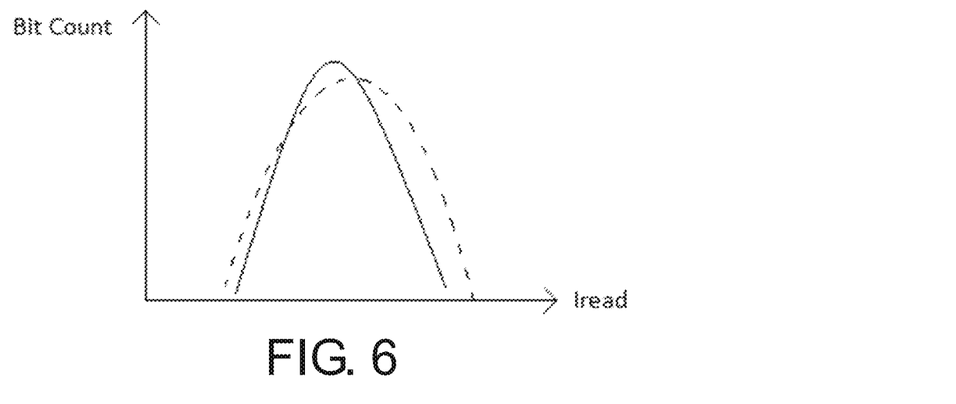
FIG. 6 is a plot of memory circuit operating parameters, in accordance with some embodiments.

FIG. 6 is a plot of memory circuit operating parameters, in accordance with some embodiments. FIG. 6 depicts bit count as a function of a current Iread generated in a memory cell during a read operation, e.g., an external scanning read (ESR) operation. The bit count corresponds to a number of RRAM memory cells in a memory array corresponding to a given current Iread.

The solid curve represents a bit count distribution of a memory macro including memory circuit 100, and current Iread corresponding to current Ic in memory cells 120, discussed above with respect to FIG. 1. The dashed curve represents a bit count distribution and current Iread of a memory macro that does not include memory circuit 100 configured to limit programming current as discussed above.

As indicated by the solid curve relative to the dashed curve, the bit count distribution corresponding to memory circuit 100 has a higher minimum value of current Iread, lower maximum value of current Iread, and higher maximum bit count (not labeled) than the other bit count distribution. FIG. 6 thereby illustrates the tighter distribution of read currents achievable with memory circuit 100 compared to approaches that do not include memory circuit 100 configured to limit programming current as discussed above.

Figure 7:
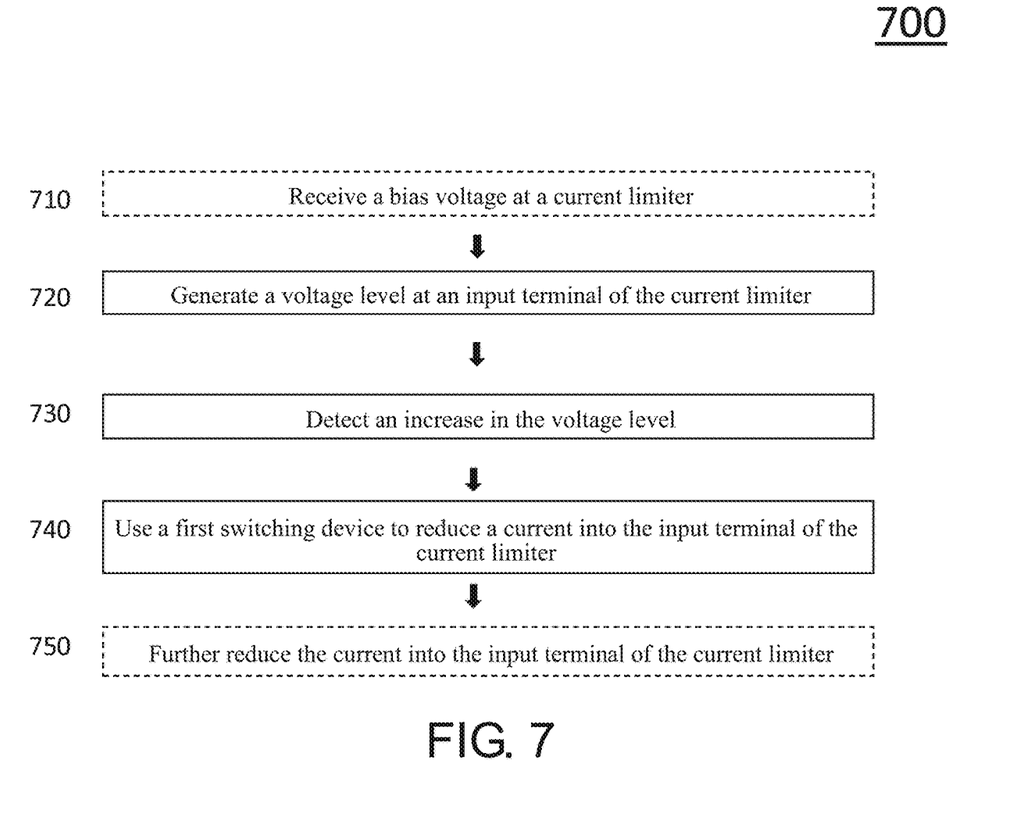
FIG. 7 is a flowchart of a method of limiting a current, in accordance with some embodiments.

FIG. 7 is a flowchart of a method 700 of limiting a current, in accordance with some embodiments. Method 700 is usable with a memory circuit, e.g., memory circuit 100 discussed above with respect to FIG. 1, and/or with a current limiter, e.g., current limiter 150 discussed above with respect to FIG. 1 or current limiter 500 discussed above with respect to FIGS. 5A-5C.

In some embodiments, limiting the current using method 700 includes forming a filament, e.g., filament F1 discussed above with respect to RRAM device 300 and FIG. 3B, in an RRAM device, e.g., an RRAM device of memory cell 120 discussed above with respect to FIG. 1.

The sequence in which the operations of method 700 are depicted in FIG. 7 is for illustration only; the operations of method 700 are capable of being executed in sequences that differ from that depicted in FIG. 7. In some embodiments, operations in addition to those depicted in FIG. 7 are performed before, between, during, and/or after the operations depicted in FIG. 7. In some embodiments, the operations of method 700 are a subset of operations of a method of operating a memory macro.

At operation 710, in some embodiments, a bias voltage is received at a current limiter. Receiving the bias voltage includes receiving the bias voltage having a bias voltage level usable by the current limiter to control one or more current limit levels. In some embodiments, receiving the bias voltage includes receiving the bias voltage at a gate of at least one transistor. In various embodiments, receiving the bias voltage at the gate of at least one transistor includes operating the at least one transistor in the linear region or the saturation region.

In some embodiments, receiving the bias voltage at the current limiter includes receiving bias voltage VB at input terminal 153 of current limiter 150 discussed above with respect to FIG. 1 and current limiter 500 discussed above with respect to FIGS. 5A-5C.

In some embodiments, receiving the bias voltage includes receiving the bias voltage having the bias voltage level corresponding to a compliance current of the RRAM device. In some embodiments, receiving the bias voltage includes receiving the bias voltage having the bias voltage level corresponding to current I1 discussed above with respect to memory circuit 100 and FIG. 1.

In some embodiments, receiving the bias voltage includes receiving the bias voltage having the bias voltage level based on a first reference voltage. In some embodiments, receiving the bias voltage includes receiving the bias voltage having the bias voltage level based on reference voltage VR1 discussed above with respect to memory circuit 100 and FIG. 1.

In some embodiments, receiving the bias voltage includes receiving a second reference voltage at the current limiter. In some embodiments, receiving the second reference voltage includes receiving reference voltage VR2 at input terminal 155 of current limiter 150 discussed above with respect to FIG. 1 and current limiter 500 discussed above with respect to FIGS. 5A-5C. In some embodiments, receiving the bias voltage includes receiving the second reference voltage having a same reference voltage level as the first reference voltage.

In some embodiments, receiving the bias voltage includes generating the bias voltage. In some embodiments, generating the bias voltage includes generating the bias voltage having the bias voltage level corresponding to the compliance current of the RRAM device and/or based on the first reference voltage. In some embodiments, generating the bias voltage level includes outputting bias voltage VB to output terminal 142 of bias voltage generator 140 discussed above with respect to FIG. 1 and bias voltage generator 400 discussed above with respect to FIG. 4.

In some embodiments, receiving the bias voltage at the current limiter includes the current limiter being the sole current limiter receiving the bias voltage. In some embodiments, the current limiter is one current limiter of a plurality of current limiters, and receiving the bias voltage includes receiving the bias voltage at each current limiter of the plurality of current limiters.

At operation 720, a voltage level is generated at an input terminal of the current limiter. Generating the voltage level includes receiving a current at the input terminal of the current limiter, and limiting the current to first current limit levels. In some embodiments, generating the voltage includes receiving current Ic and generating voltage VD at input terminal 151 of current limiter 150 discussed above with respect to FIG. 1 and current limiter 500 discussed above with respect to FIGS. 5A-5C.

The first current limit levels are based on the current having a first functional relationship to the voltage level that has a first positive slope. In some embodiments, the first functional relationship corresponds to one or more transistors of the current limiter operating in the linear region based on the bias voltage level of the bias voltage. In some embodiments, the first current limit levels are based on the current being conducted through transistors N3 and N4 discussed above with respect to current limiter 500 and FIGS. 5A-5C.

In some embodiments, generating the voltage level includes applying a cell voltage across a resistive layer of the RRAM device, thereby generating the current in response to applying the cell voltage. In some embodiments, applying the cell voltage is part of a programming operation of the memory macro.

In some embodiments, applying the cell voltage includes applying bit line voltage VBL having a programming voltage level to input terminal 121 of memory cell 120 discussed above with respect to memory circuit 100 and FIG. 1. In some embodiments, applying the cell voltage includes applying the cell voltage across resistive layer L1 discussed above with respect to RRAM device 300 and FIGS. 3A and 3B.

In some embodiments, generating the voltage level at the input terminal includes generating the voltage level at a terminal of the RRAM device. In some embodiments, generating the voltage level at the terminal of the RRAM device includes generating voltage VD at output terminal 122 of memory cell 120 discussed above with respect to memory circuit 100 and FIG. 1.

At operation 730, an increase in the voltage level is detected. Detecting the increase in the voltage level is based on an increase in the current level of the received current and the first positive slope of the first functional relationship between the received current and the voltage level. In some embodiments, detecting the increase in the voltage level includes detecting an increase in the voltage level of voltage VD at input terminal 151 of current limiter 150 discussed above with respect to FIG. 1 and current limiter 500 discussed above with respect to FIGS. 5A-5C.

In some embodiments, detecting the increase in the voltage level includes comparing the voltage level to the reference voltage level of the second reference voltage. In some embodiments comparing the voltage level to the reference voltage level of the second reference voltage includes comparing the voltage level of voltage VD to the reference voltage level of reference voltage VR2 received at respective input terminals 151 and 155 of current limiter 150 discussed above with respect to FIG. 1 and current limiter 500 discussed above with respect to FIGS. 5A-5C.

In some embodiments, detecting an increase in the voltage level of voltage VD at input terminal 151 includes detecting the increase in the voltage level of voltage VD at output terminal 122 of memory cell 120 discussed above with respect to FIG. 1 and RRAM device 300 discussed above with respect to FIGS. 3A and 3B.

In some embodiments, detecting the increase in the voltage level includes detecting an increase in the current through the resistive layer of the RRAM device. In some embodiments, detecting the increase in the current includes detecting the increase in current Ic through a resistive layer, e.g., resistive layer L1 of RRAM device 300 discussed above with respect to FIGS. 3A and 3B, of a memory cell, e.g., memory cell 120 discussed above with respect to memory circuit 100 and FIG. 1.

In some embodiments, detecting the increase in the current includes detecting the formation and/or increased conduction of one or more filaments in the resistive layer of the RRAM device. In some embodiments, detecting the formation and/or increased conduction of one or more filaments includes detecting the formation and/or increased conduction of filament F1 discussed above with respect to RRAM device 300 and FIGS. 3A and 3B.

At operation 740, in response to detecting the increase in the voltage level and thereby the increase in the current, a first switching device is used to reduce the current into the input terminal of the current limiter. Using the first switching device includes switching off the first switching device to interrupt a current path in the current limiter. In some embodiments, reducing the current includes reducing a number of current paths through which the current is conducted. In some embodiments, reducing the number of current paths includes interrupting one of two current paths. In some embodiments, using the first switching device to reduce the current includes switching off switching device N6 to interrupt current path P2 of current paths P1 and P2 through which current Ic is conducted, discussed above with respect to current limiter 500 and FIGS. 5A-5C.

In some embodiments, in response to the first switching device interrupting the current path, reducing the current includes applying second current limit levels different from the first current limit levels. The second current limit levels are based on the current having a second functional relationship to the voltage level that has a second positive slope different from the first positive slope. In some embodiments, the second positive slope is different from the first positive slope based on reducing a number of transistors used to conduct the current by reducing the number of current paths.

In some embodiments, the second functional relationship corresponds to one or more transistors of the current limiter operating in the linear region and/or the saturation region based on the bias voltage level of the bias voltage. In some embodiments, the second functional relationship and second current limit levels are based on the current being conducted through transistor N3 discussed above with respect to current limiter 500 and FIGS. 5A-5C.

In some embodiments, reducing the current includes causing the one or more transistors to change from operating in the linear region to operating in the saturation region. In some embodiments, changing from operating in the linear region to operating in the saturation region generates a voltage level increase in addition to the increase detected in operation 730.

In some embodiments, using the first switching device includes generating a logical state of a signal corresponding to the voltage level being greater than the reference voltage level of the second reference voltage. In some embodiments, generating the logical state of the signal includes generating signal SW2 discussed above with respect to current limiter 150 and FIG. 1 and current limiter 500 and FIGS. 5A-5C.

In some embodiments, reducing the current includes reducing the current through the resistive layer of the RRAM device. In some embodiments, reducing the current through the resistive layer of the RRAM device includes reducing a stress level, e.g., a temperature, of the resistive layer. In some embodiments, reducing the current includes reducing current Ic through the resistive layer, e.g., resistive layer L1 of RRAM device 300 discussed above with respect to FIGS. 3A and 3B, of a memory cell, e.g., memory cell 120 discussed above with respect to memory circuit 100 and FIG. 1.

In some embodiments, reducing the current through the resistive layer of the RRAM device includes reducing the cell voltage across the resistive layer by causing the one or more transistors to change from operating in the linear region to operating in the saturation region, thereby increasing the voltage level at a terminal of the RRAM device. In some embodiments, reducing the current through the resistive layer of the RRAM device includes reducing current Ic by causing transistor N3, discussed above with respect to current limiter 500 and FIGS. 5A-5C, to change from operating in the linear region to operating in the saturation region, thereby increasing voltage VD at output terminal 122 of memory cell 120 discussed above with respect to FIG. 1 and RRAM device 300 discussed above with respect to FIGS. 3A and 3B.

In some embodiments, reducing the current includes reducing the current through one or more filaments in the resistive layer of the RRAM device. In some embodiments, reducing the current through the one or more filaments includes reducing current Ic through filament F1 discussed above with respect to RRAM device 300 and FIGS. 3A and 3B.

At operation 750, in some embodiments, the current into the input terminal of the current limiter is further reduced. In some embodiments, further reducing the current includes using a second switching device to interrupt a current path in addition to the current path interrupted in operation 740, and through which the current is conducted.

In some embodiments, further reducing the current includes applying the third current limit level to current Ic discussed above with respect to memory circuit 100 and FIG. 1. In some embodiments, further reducing the current includes further reducing the current to a current level of approximately zero amperes.

In some embodiments, further reducing the current includes further reducing the number of current paths through which the current is conducted. In some embodiments, further reducing the number of current paths includes interrupting the second one of two current paths. In some embodiments, further reducing the current includes switching off switching device N5 to interrupt current path P1 of current paths P1 and P2 through which current Ic is conducted, discussed above with respect to current limiter 500 and FIGS. 5A-5C.

In some embodiments, further reducing the current includes further reducing the current following a predefined time delay after detecting the increase in the voltage level in operation 730. In some embodiments, further reducing the current includes further reducing the current following time delay td discussed above with respect to current limiter 500 and FIGS. 5A-5C.

In some embodiments, further reducing the current includes generating a logical state of a signal corresponding to the voltage level being greater than the reference voltage level of the second reference voltage following the predefined time delay. In some embodiments, generating the logical state of the signal includes generating signal SW1 discussed above with respect to current limiter 150 and FIG. 1 and current limiter 500 and FIGS. 5A-5C. In some embodiments, generating signal SW1 includes generating signal SW1 using delay element DE discussed above with respect to current limiter 500 and FIGS. 5A-5C.

In some embodiments, further reducing the current includes further reducing the current through the resistive layer of the RRAM device. In some embodiments, further reducing the current through the resistive layer of the RRAM device includes further reducing the stress level, e.g., the temperature, of the resistive layer. In some embodiments, further reducing the current includes further reducing current Ic through the resistive layer, e.g., resistive layer L1 of RRAM device 300 discussed above with respect to FIGS.

3A and 3B, of a memory cell, e.g., memory cell 120 discussed above with respect to memory circuit 100 and FIG. 1.

In some embodiments, further reducing the current includes further reducing the current through one or more filaments in the resistive layer of the RRAM device. In some embodiments, further reducing the current through the one or more filaments includes further reducing current Ic through filament F1 discussed above with respect to RRAM device 300 and FIGS. 3A and 3B.

By executing some or all of the operations of method 700, a current, e.g., an RRAM device current generated as part of forming a filament in a programming operation, is limited using a current limiter, thereby achieving the benefits discussed above with respect to current limiter 150 of memory circuit 100 and current limiter 500.

In some embodiments, a method of forming a filament in an RRAM device includes applying a cell voltage across a resistive layer of the RRAM device, detecting an increase in a current through the resistive layer generated in response to the applied cell voltage, and in response to detecting the increase in the current, using a first switching device to reduce the current through the resistive layer. In some embodiments, applying the cell voltage across the resistive layer of the RRAM device includes applying a programming voltage level to a first terminal of the RRAM device, and detecting the increase in the current includes detecting an increase in a voltage level at a second terminal of the RRAM device. In some embodiments, detecting the voltage level at the second terminal of the RRAM device includes comparing the voltage level at the second terminal of the RRAM device to a reference voltage level. In some embodiments, using the first switching device to reduce the current through the resistive layer includes operating a transistor in a saturation region. In some embodiments, the method includes, in response to detecting the increase in the current, using a second switching device to further reduce the current through the resistive layer. In some embodiments, using the second switching device to further reduce the current through the resistive layer includes applying a predefined delay period. In some embodiments, using the first switching device to reduce the current through the resistive layer and using the second switching device to further reduce the current through the resistive layer are in response to a transition in a signal output by an amplifier.

In some embodiments, a method of limiting a current includes receiving a bias voltage at a gate of a first transistor and a gate of a second transistor, generating a voltage level by using the first and second transistors to conduct a first current received from an RRAM device, and in response to detecting an increase in the voltage level, reducing the first current through the RRAM device by switching off a switching device in series with the first transistor. In some embodiments, receiving the bias voltage at the gates of the first and second transistors includes receiving the bias voltage having a bias voltage level corresponding to a compliance current of the RRAM device. In some embodiments, receiving the bias voltage at the gates of the first and second transistors includes generating the bias voltage by using a third transistor to conduct a second current having a predetermined current level based on the compliance current of the RRAM device. In some embodiments, using the first and second transistors to conduct the first current and using the third transistor to conduct the second current include the first, second, and third transistors having dimensions configured to conduct the second current approximately equal to the first current based on the bias voltage. In some embodiments, generating the bias voltage by using the third transistor to conduct the second current includes using a first amplifier to generate the bias voltage at a gate of the third transistor based on a first reference voltage having a reference voltage level. In some embodiments, switching off the switching device is in response to a signal generated by a second amplifier based on a second reference voltage having the reference voltage level. In some embodiments, a memory circuit includes the first and second transistors and the switching device, the memory circuit is one memory circuit of a plurality of memory circuits, and receiving the bias voltage at the gates of the first and second transistors includes each memory circuit of the plurality of memory circuits receiving the bias voltage from a single bias voltage generator.

In some embodiments, a method of programming an RRAM device includes generating a cell current by applying a cell voltage across a resistive layer of the RRAM device, conducting the cell current through first and second parallel current paths, thereby generating a voltage level, wherein the first current path includes a first transistor in series with a first switching device and the second current path includes a second transistor in series with a second switching device, and in response to detecting an increase in the voltage level, switching off the second switching device, thereby causing the first transistor to operate in a saturation region. In some embodiments, conducting the cell current through the first and second parallel current paths includes controlling the first and second transistors with a single bias voltage. In some embodiments, conducting the cell current through the first and second parallel current paths includes operating each of the first and second transistors in a linear region. In some embodiments, detecting the increase in the voltage level includes comparing the voltage level to a reference voltage having a reference voltage level ranging from 0.08 V to 0.3 V. In some embodiments, causing the first transistor to operate in the saturation region includes limiting the cell current to a current limit level ranging from less than 50 μA to 500 μA. In some embodiments, the method includes, in response to detecting the increase in the voltage level, switching off the first switching device after a predefined delay period ranging from 100 ns to 1000 ns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a filament in a resistive random-access memory (RRAM) device, the method comprising:
   applying a cell voltage across a resistive layer of the RRAM device;
   detecting an increase in a current through the resistive layer generated in response to the applied cell voltage; and
   in response to the detecting the increase in the current, using a first switching device to reduce the current through the resistive layer.

2. The method of claim 1, wherein
the applying the cell voltage across the resistive layer of the RRAM device comprises applying a programming voltage level to a first terminal of the RRAM device, and
the detecting the increase in the current comprises detecting an increase in a voltage level at a second terminal of the RRAM device.

3. The method of claim 2, wherein the detecting the voltage level at the second terminal of the RRAM device comprises comparing the voltage level at the second terminal of the RRAM device to a reference voltage level.

4. The method of claim 1, wherein the using the first switching device to reduce the current through the resistive layer comprises operating a transistor in a saturation region.

5. The method of claim 1, further comprising:
in response to the detecting the increase in the current, using a second switching device to further reduce the current through the resistive layer.

6. The method of claim 5, wherein the using the second switching device to further reduce the current through the resistive layer comprises applying a predefined delay period.

7. The method of claim 6, wherein the using the first switching device to reduce the current through the resistive layer and using the second switching device to further reduce the current through the resistive layer are in response to a transition in a signal output by an amplifier.

8. A method of limiting a current, the method comprising:
receiving a bias voltage at a gate of a first transistor and a gate of a second transistor;
generating a voltage level by using the first and second transistors to conduct a first current received from a resistive random-access memory (RRAM) device; and
in response to detecting an increase in the voltage level, reducing the first current through the RRAM device by switching off a switching device in series with the first transistor.

9. The method of claim 8, wherein the receiving the bias voltage at the gates of the first and second transistors comprises receiving the bias voltage having a bias voltage level corresponding to a compliance current of the RRAM device.

10. The method of claim 9, wherein the receiving the bias voltage at the gates of the first and second transistors comprises generating the bias voltage by using a third transistor to conduct a second current having a predetermined current level based on the compliance current of the RRAM device.

11. The method of claim 10, wherein the using the first and second transistors to conduct the first current and the using the third transistor to conduct the second current comprise the first, second, and third transistors having dimensions configured to conduct the second current approximately equal to the first current based on the bias voltage.

12. The method of claim 10, wherein the generating the bias voltage by using the third transistor to conduct the second current comprises using a first amplifier to generate the bias voltage at a gate of the third transistor based on a first reference voltage having a reference voltage level.

13. The method of claim 12, wherein the switching off the switching device is in response to a signal generated by a second amplifier based on a second reference voltage having the reference voltage level.

14. The method of claim 8, wherein
a memory circuit comprises the first and second transistors and the switching device,
the memory circuit is one memory circuit of a plurality of memory circuits, and
the receiving the bias voltage at the gates of the first and second transistors comprises each memory circuit of the plurality of memory circuits receiving the bias voltage from a single bias voltage generator.

15. A method of programming a resistive random-access memory (RRAM) device, the method comprising:
generating a cell current by applying a cell voltage across a resistive layer of the RRAM device;
conducting the cell current through first and second parallel current paths, thereby generating a voltage level, wherein
the first current path comprises a first transistor in series with a first switching device, and
the second current path comprises a second transistor in series with a second switching device; and
in response to detecting an increase in the voltage level, switching off the second switching device, thereby causing the first transistor to operate in a saturation region.

16. The method of claim 15, wherein the conducting the cell current through the first and second parallel current paths comprises controlling the first and second transistors with a single bias voltage.

17. The method of claim 15, wherein the conducting the cell current through the first and second parallel current paths comprises operating each of the first and second transistors in a linear region.

18. The method of claim 15, wherein the detecting the increase in the voltage level comprises comparing the voltage level to a reference voltage having a reference voltage level ranging from 0.08 volts (V) to 0.3 V.

19. The method of claim 15, wherein the causing the first transistor to operate in the saturation region comprises limiting the cell current to a current limit level ranging from less than 50 microamperes (µA) to 500 µA.

20. The method of claim 15, further comprising, in response to the detecting the increase in the voltage level, switching off the first switching device after a predefined delay period ranging from 100 nanoseconds (ns) to 1000 ns.

* * * * *